(12) United States Patent
Kodama (10) Patent No.: US 6,894,545 B2
(45) Date of Patent: May 17, 2005

(54) INTEGRATED CIRCUIT

(75) Inventor: Hidetaka Kodama, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/465,764

(22) Filed: Jun. 20, 2003

(65) Prior Publication Data

US 2004/0124898 A1 Jul. 1, 2004

(30) Foreign Application Priority Data

Dec. 26, 2002 (JP) ........................................ 2002-375998

(51) Int. Cl.$^7$ ................................................. H03L 7/00
(52) U.S. Cl. ..................................... 327/143; 327/198
(58) Field of Search ................................ 327/142, 143, 327/198

(56) References Cited

U.S. PATENT DOCUMENTS 6,204,706 B1 * 3/2001 Horvath ...................... 327/198

FOREIGN PATENT DOCUMENTS

JP          05-075064          3/1993

* cited by examiner

*Primary Examiner*—Jeffrey Zweizig
(74) *Attorney, Agent, or Firm*—Volentine, Francos & Whitt, PLLC

(57) ABSTRACT

An integrated circuit comprising a circuit block whose power supply is controlled by waiting operation, is supplied which is able to prevent the occurrence of penetrating electricity caused by unstable signals output from the circuit block whose power supply was broken. In the integrated circuit, a mask signal is set at "L" level before a power in the circuit block is broken, a latch circuit formed by a NAND and an inverter keeps a node in "L" state, then when the power supply is broken and drops into "L" level, the output signal of the NAND is fixed in "H" level. Thus, from the circuit block, even if a unstable mask signal is output, the node keeps in "L" level, so that gate circuits become off.

21 Claims, 4 Drawing Sheets

INTEGRATED CIRCUIT

BACKGROUND OF THE INVENTION

1. Field of the Invention

The invention relates to an integrated circuit having a circuit block in which power supply is controlled by a waiting operation or the like.

2. Related Background Art

In conventional integrated circuit having a circuit block in which power supply is controlled by a waiting operation, when the input circuit of second circuit block inputs a signal output from first circuit block whose power supply has been broken, the input signal is put in a floating state. Thus, penetrating electricity occurred. Because of this, there is a problem that consumption electricity increased, so it is necessary to tackle this problem.

Figure 2:
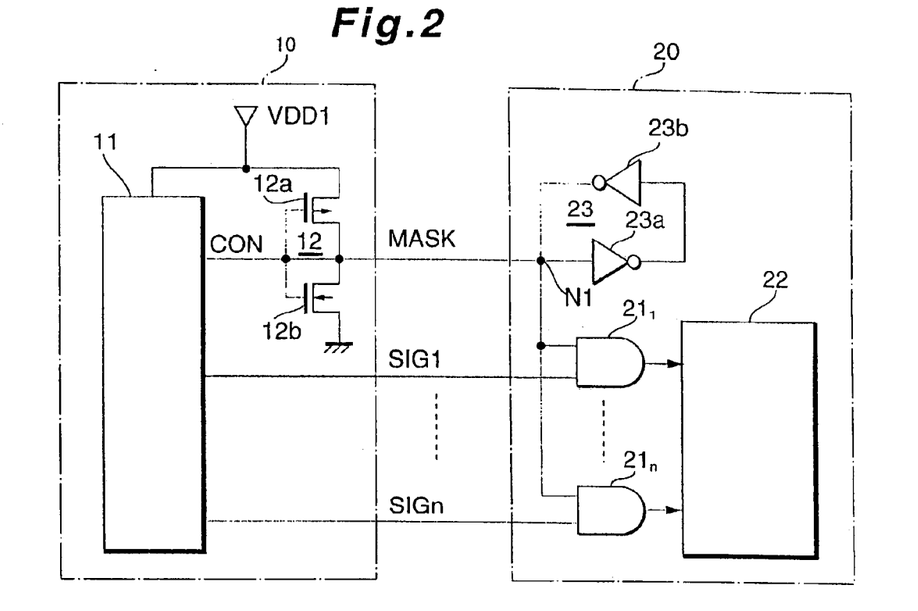
FIG. 2 is a block diagram showing a conventional integrated circuit.

FIG. 2 is a block diagram showing a conventional integrated circuit processed by floating countermeasure of input signal.

The integrated circuit comprises a circuit block 10 in which a power supply is controlled, and a circuit block 20 in which a power supply is always supplied.

On one hand, the circuit block 10 has a logical circuit 11 that operates when the power supply is VDD1, and an inverter 12. The logical circuit 11 has a function to output signals SIG1~SIGn serving as data towards the circuit block 20, and a control signal CON used for notifying of a breaking of the power supply just before the power supply is broken. The inverter 12 has a MOS transistor 12a with P channel (hereinafter: PMOS) and a MOS transistor 12b with N channel (hereinafter: NMOS). The PMOS and the NMOS are connecting in series each other. Then, the inverter inputs the control signal CON, and inverts the control signal CON, further output the signal inverted as a mask signal MASK.

On the other hand, the circuit block 20 has logical product gates (with respect to each, hereinafter: AND) $21_1$~$21_n$ whose first input terminals receive the signals SIG1~SIGn respectively, and a logical circuit 22 receiving output signals respectively output from the ANDs $21_1$~$21_n$. Further, the circuit block 20 has a node N1 receiving the mask signal MASK from the circuit block 10. At the node N1, while a latch circuit 23 formed from two inverters 23a and 23b mutually connecting in a loop is jointed, second input terminals of the ANDs $21_1$~$21_n$ are jointed. Otherwise, the output impedance of the latch circuit 23 is set and is sufficiently bigger than that of the inverter 12 in the circuit block 10.

In such integrated circuit, when supplying the circuit block 10 with a effective power supply VDD1, the control signal CON is set at low level "L", then the mask signal MASK becomes high level "H". Thus, because the node N1 receives the mask signal MASK, the node N1 becomes "H" and the latch circuit 23 is kept in "H" level by compulsion. In this case, these signals SIG1~SIGn output from the logical circuit 11 are transferred to the logical circuit 22 through these ANDs $21_1$~$S21_n$.

Next, as a preparation for breaking the power supply of the circuit block 10, in the state that the effective voltage VDD1 of the power supply is being supplied, the control signal CON changes into "H". Thus, the mask signal MASK becomes "L". Because of this, the node N1 becomes "L" and the latch circuit 23 is kept in "L" level by compulsion. In this case, all the ANDs $21_1$~$S21_n$ output signals indicating "L" level.

Then, the voltage VDD1 of the power supply of the circuit block 10 is broken. The output side of the inverter 12 in the circuit block 10 is put in high-impedance state. However, because the latch circuit 23 outputs "L" signal to the node N1 so that the logical circuit 22 still receives signals all indicating "L", the input side of the logical circuit 22 does not become high-impedance state.

Moreover, with respect to the circuit block 10, when the voltage VDD1 of the power supply is supplied again, by operations such as reset or the like, the mask signal MASK fixed in "L" state is changed into "H". Thus, the latch circuit 23 in the circuit block 20 is set in "H" level by compulsion again, so these signals SIG1~SIGn output from the logical circuit 11 can be transferred to the logical circuit 22 through these ANDs $21_1$~$S21_n$.

However, in such conventional integrated circuit, there are the following problems.

(1) The mask signal MASK, when the power supply of the circuit block 10 is broken completely, becomes high-impedance state. But during the voltage VDD1 drops completely from a operation-guaranteeing value to 0V, the mask signal MASK maybe makes the latch circuit 23 keep "H". Thus, even if the power supply has been broken, the node N1 maybe keeps in "H" level. Because of this, the logical circuit 22 in the circuit block 20 will receive some unstable signal, so that penetrating electricity increases.

(2) In the state that the power supply was broken, if some noise is mixed in the mask signal MASK, the unstable signals SIG1~SIGn will enter the logical circuit 22, so that penetrating electricity occurs.

(3) When the mask signal MASK changes, the signal on the node N1, because conflicting with the output signal of the latch circuit 23, changes behind the changing time of the mask signal MASK. Thereby, if the mask signal MASK is not used for mask control, with respect to the node N1, it is impossible to obtain a correct time.

(4) In general, in order to judge the quality of an integrated circuit, a scan test is performed. In such scan test, though the power supply is being supplied, the mask signal MASK output from the circuit block 10 changes into "L" or "H". When the mask signal MASK becomes "L", all the ANDs $21_1$~$21_n$ in the circuit block 20 becomes off, so that the signal SIG1~SIGn output from the circuit block 10 could not enter the logical circuit 22. Thus, the scan test could not be performed completely.

(5) While the power supply of the circuit block 10 is supplied again and its voltage VDD1 rises to an operation guaranteeing value from 0V, even if fixedly setting the mask signal MASK at "L" level by reset operation or the like, the "L" level of the mask signal MASK can not be guaranteed. Because of this, if only the node N1 receives a "H" signal for an instant, the latch circuit 23 will keep the "H" level, so that the node N1 is set by "H". Thus, the unstable signals SIG1~SIGn of the circuit block 10 will enter the logical circuit 22 results in wrong operation.

SUMMARY OF THE INVENTION

To solve the conventional problems as mentioned above, the present invention supplies an integrated circuit capable of preventing the occurrence of penetrating electricity caused by the input of unstable signals According to the invention, there is provided an integrated circuit comprising:

a first circuit block in which a first power supply is controlled;

and a second power supply which has logical circuit and in which a second power supply is always supplied, wherein when the first power supply is broken, a mask signal output to the second circuit block from the first circuit block is changed into low level from high level in order to cut off output signals of the first circuit block, wherein the second circuit block includes:

a first node on which the mask signal is supplied;

a first latch circuit which is formed by a first logical gate and a second logical gate, wherein the first logical gate inputs the first power supply and the mask signal, the second logical gate inputs a output signal of the first logical gate, and the output terminal of the second logical gate and the input terminal of the first logical gate are connected with the first node, wherein the first latch circuit keeps the level of the first node when the first power supply in the first circuit block is effective with respect to the second logical gate; and outputs a low level signal to the first node when the first power supply in the first circuit block is ineffectual.

First, in the present invention, the integrate circuit further may comprise a gate circuit. The gate circuit is respectively connected with the output of the first circuit block and the first node, inputs the output signals of the first circuit block if the first node indicates high level; and stops the input of the output signals if the first node indicates low level.

In the integrated circuit, the first gate and the second gate all may be inverter.

Further, in the integrated circuit, the second circuit block may have a first buffer. The first buffer amplifies the mask signal output from the first circuit block, then outputs the mask signal amplified to the first node.

Further, in the integrated circuit, the second circuit block may more have a second buffer which also amplifies the mask signal output from the first circuit block and outputs the mask signal amplified, and a optional control which outputs based on the mask signal output from the first circuit block and the second buffer. On the optional control gate, optional circuit can be joined.

Second, in the present invention, the integrated circuit may further comprise:

a filter circuit which is connected with the first node, outputs a low level at a predetermined period when the first node indicates low level, and outputs a high level when the first node keeps high level for a prescribed time;

a second node on which the output of the filter circuit is supplied;

a gate circuit which is respectively connected with a output terminal of the first circuit block and with the second node, inputs output signals of the first circuit block when the second node indicates high level, and stops the input of output signals of the first circuit block when the second node indicates low level.

In the integrated circuit, the first gate and the second gate all may be inverter.

Further, in the integrated circuit, the second circuit block may have a first buffer which amplifies the mask signal output from the first circuit block, and outputs the mask signal amplified to the first node.

Further, in the integrated circuit, the second circuit block may more have a second buffer which also amplifies the mask signal output from the first circuit block and outputs the mask signal amplified, and a optional control which outputs based on the mask signal output from the first circuit block and the second buffer, wherein the optional control gate is joined by optional circuit.

Third, in the present invention, the integrated circuit may further comprise:

a third node on which a test mode signal output from the first circuit block is supplied;

a second latch circuit which is formed by a third logical gate and a fourth logical gate;

a input control circuit for outputting a control signal according to the levels of the first node and the third node;

a four node on which a output of the input control circuit is supplied;

a gate circuit which is respectively connected with a output terminal of the first circuit block and with the fourth node, inputs output signals of the first circuit block when the fourth node indicates high level, and stops the input of output signals of the first circuit block when the fourth node indicates low level, wherein the third logical gate inputs the first power supply in the first circuit block and the test mode signal, the fourth logical gate inputs a output signal of the third logical gate, and the output terminal of the fourth logical gate and the input terminal of the third logical gate are connected with the third node, wherein the second latch circuit keeps the level of the third node when the first power supply in the first circuit block is effective with respect to the third logical gate; and outputs a low level signal to the third node when the first power supply in the first circuit block is ineffectual.

In the integrated circuit, the first gate, the second gate, the third gate and the fourth gate all may be inverter.

Further, in the integrated circuit, the second circuit block may have a first buffer which amplifies the mask signal output from the first circuit block, and outputs the mask signal amplified to the first node.

Further, in the integrated circuit, the second circuit block may more have a second buffer which also amplifies the mask signal output from the first circuit block and outputs the mask signal amplified, and a optional control which outputs based on the mask signal output from the first circuit block and the second buffer, wherein the optional control gate is joined by optional circuit.

According to the invention, further, there is provided an other integrated circuit comprising:

a first circuit block in which a first power supply is controlled;

and a second power supply which has logical circuit and in which a second power supply is always supplied, wherein when the first power supply is broken, a mask signal output to the second circuit block from the first circuit block is changed into low level from high level in order to cut off output signals of the first circuit block, wherein the second circuit block includes:

a first node on which the mask signal is supplied;

a switch circuit which becomes off state when the first power supply in the first circuit block is effective, and becomes on state for making the first node receive a low level when the first power supply in the first circuit block is ineffectual;

a latch circuit which is formed by a first logical gate and a second logical gate;

a gate circuit which inputs the output signals of the first circuit block if the first node indicates high level; and stops the input of the output signals if the first node indicates low level, wherein the first logical gate inputs the first power supply and the mask signal, the second logical gate inputs a output signal of the first logical gate, and the output terminal of the second logical gate and the input terminal of the first logical gate are connected with the first node, wherein the first latch circuit keeps the level of the first node when the first power supply in the first circuit block is effective with respect to the second logical gate; and outputs a low level signal to the first node when the first power supply in the first circuit block is ineffectual.

The above and other objects and features of the present invention will become apparent from the following detailed description and the appended claims with reference to the accompanying drawings.

DETAILED DESCRIPTION OF THE PREFERRED EMBODIMENTS

With respect to embodiments of the present invention, while referring to diagrams, the following is to explain them in detail.

<Embodiment 1>

Figure 1A:
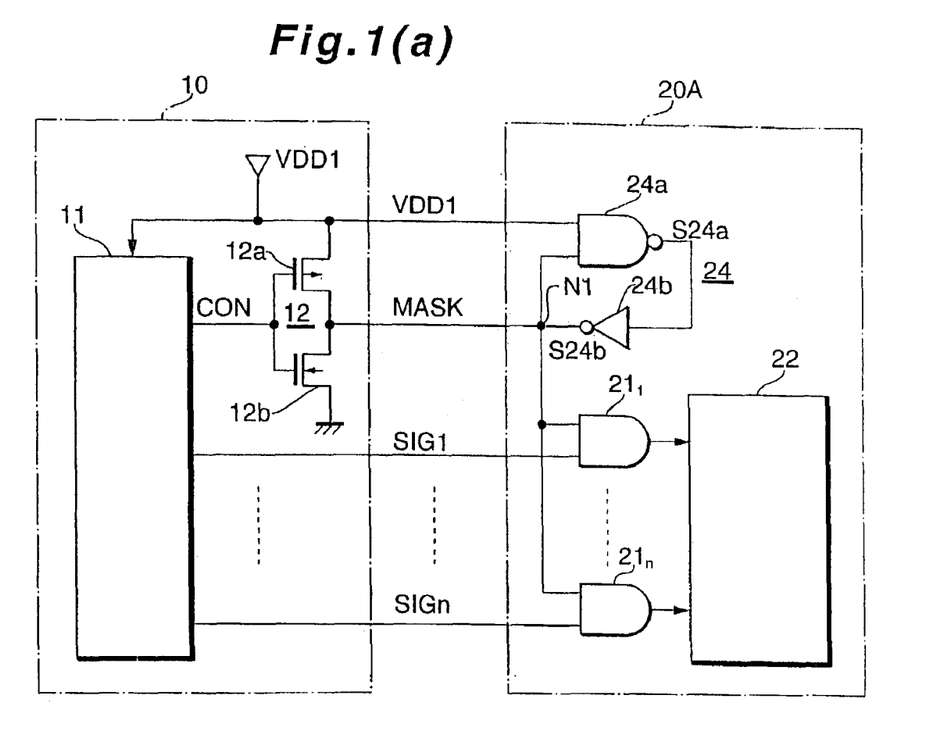
FIGS. 1a and 1b are diagrams for explaining first embodiment of integrated circuit of the present invention.
Figure 1B:
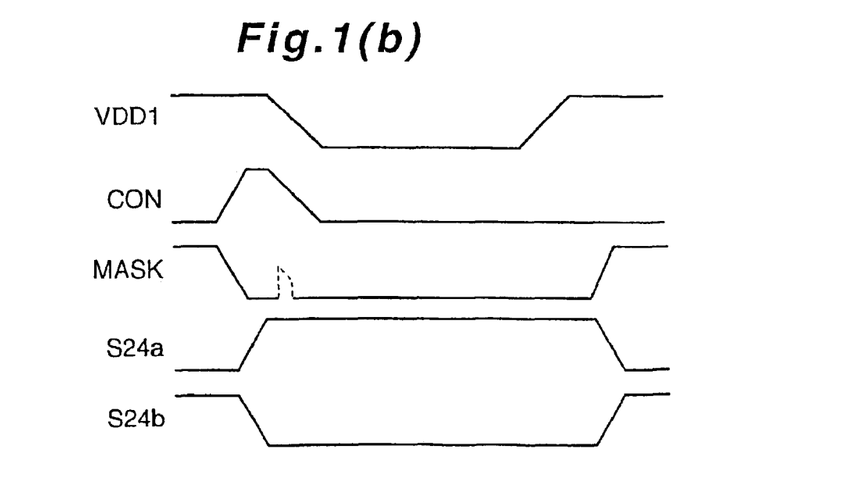

FIG. 1 is a diagram for explaining embodiment 1 of integrated circuit of the present invention. FIG. 1(a) is a block diagram, and FIG. 1(b) is a signal wave-shape diagram. In these diagrams, with respect to the same composition element as that in FIG. 2, the same symbol is assigned.

The integrated circuit comprises a first circuit block 10 whose power supply is controlled, and a second circuit block 20A whose power supply is always supplied.

As shown by FIG. 1(a), on one hand, the circuit block 10 has a logical circuit 11 that operates when the voltage VDD1 of the power supply is supplied, and an inverter 12. The logical circuit 11 has a function to output signals SIG1~SIGn serving as data towards the circuit block 20, and a control signal CON used for notifying of a breaking of the power supply just before the power supply is broken. The inverter 12 has a PMOS 12a and a NMOS 12b that are connecting in series each other. Then, the inverter inputs the control signal CON, and inverts the control signal CON, further output the signal inverted as a mask signal MASK.

On the other hand, the circuit block 20A has ANDs $21_1$~$21_n$ with two inputs whose first input terminals receive the signals SIG1~SIGn respectively, and a logical circuit 22 receiving output signals respectively output from the ANDs $21_1$~$21_n$. Further, the circuit block 20A has a node N1 receiving the mask signal MASK from the circuit block 10. At the node N1, second input terminals of the all ANDs $21_1$~$21_n$ are jointed.

Further, at the node N1, a latch circuit 24 formed by a negative logical product gate (hereinafter: NAND) 24a and a inverter 24b is being connected. The first input terminal of the NAND 24a is connected with the node N1, and the second input terminal is connected with the power supply VDD1 in the circuit block 10. Moreover, the threshold with respect to the second input terminal of the NAND 24a is set and higher than the half of the voltage of the power supply in general, in order to detect at once the drop of the voltage VDD1. Further, the output terminal of the NAND 24a is connected with the input terminal of the inverter 24b, and the output terminal of the inverter 24b is connected with the node N1. Otherwise, the output impedance of the latch circuit 24 (that is, the output impedance of the inverter 24b) is set and is sufficiently bigger than that of the inverter 12 in the circuit block 10.

Next, referring to FIG. 1(b), to explain the operations of the integrated circuit shown by FIG. 1(a).

In such integrated circuit, when supplying the circuit block 10 with a effective power supply VDD1, the control signal CON is set at low level "L", then the mask signal MASK becomes high level "H". Thus, because the node N1 in circuit block 20A receives the mask signal MASK, the node N1 becomes "H" and the latch circuit 24 is kept in "H" level. In this case, these signals SIG1~SIGn output from the logical circuit 11 are transferred to the logical circuit 22 through these ANDs $21_1$~$S21_n$.

Then, as a preparation for breaking the power supply of the circuit block 10, in the state that the effective voltage VDD1 of the power supply is still being supplied, the control signal CON is changed into "H". Thus, the mask signal MASK becomes "L" and is sent to the node N1 in the circuit block 20A. At that time, though a "H" signal S24b is output to the node N1 from the inverter 24b, because the driving ability of the inverter 12 is sufficiently higher than that of the inverter 24b, the level of the node N1 is changed by the mask signal MASK output from the inverter 12. Thereby, the node N1 becomes "L", and the signal S24a output from the NAND 24a becomes "H", further, the signal S24b output from the inverter 24b becomes "L". Thus, the latch circuit 24 is kept in "L" level by compulsion. In this case, all the ANDs $21_1$~$S21_n$ output signals indicating "L" level.

Then, the voltage VDD1 of the power supply of the circuit block 10 is broken. Thus, the voltage VDD1 drops slowly from "H" level. When the voltage VDD1 drops under the threshold with respect to the second input terminal of the NAND 24a, the signal S24a output from the NAND 24a becomes "H" no depending upon the level of the node N1. Because of this, the signal S24b of the inverter 24b becomes "L".

Further, when the voltage VDD1 drops under operation guaranteeing range, the mask signal MASK is changed into "H" level. In this case, though the mask signal MASK conflicts with the signal S24b output from the inverter 24b, because the voltage VDD1 had already been broken, it is impossible to drive the node N1. Thus, the node N1 is keeping in "L". Thereby, these signal output to the logical circuit 22 keep in "L", that is, the input signals of the logical circuit 22 do not become high-impedance state.

Moreover, with respect to the circuit block 10, when the voltage VDD1 of the power supply is supplied again, by operations such as reset or the like, the mask signal MASK is operated in a fixing state of "L", then the mask signal is changed into "H". Thus, the latch circuit 24 in the circuit block 20A is set in "H" level by compulsion again, so these signals SIG1~SIGn output from the logical circuit 11 can be transferred to the logical circuit 22 through these ANDs $21_1$~$21_n$.

As stated above, in the embodiment 1, the integrated circuit has a latch circuit 24 which, when the voltage VDD1 of the power supply in the circuit 10 changed into "L", outputs a "L" to the node N1 no depending upon the level of the mask signal MASK.

Therefore, when stopping the power supply so that the mask signal becomes unstable, the level on the node N1 is fixed at "L". As a result, it is possible to prevent occurrence of penetrating electricity caused by unstable signals SIG1~SIGn.

<Embodiment 2>

Figure 3:
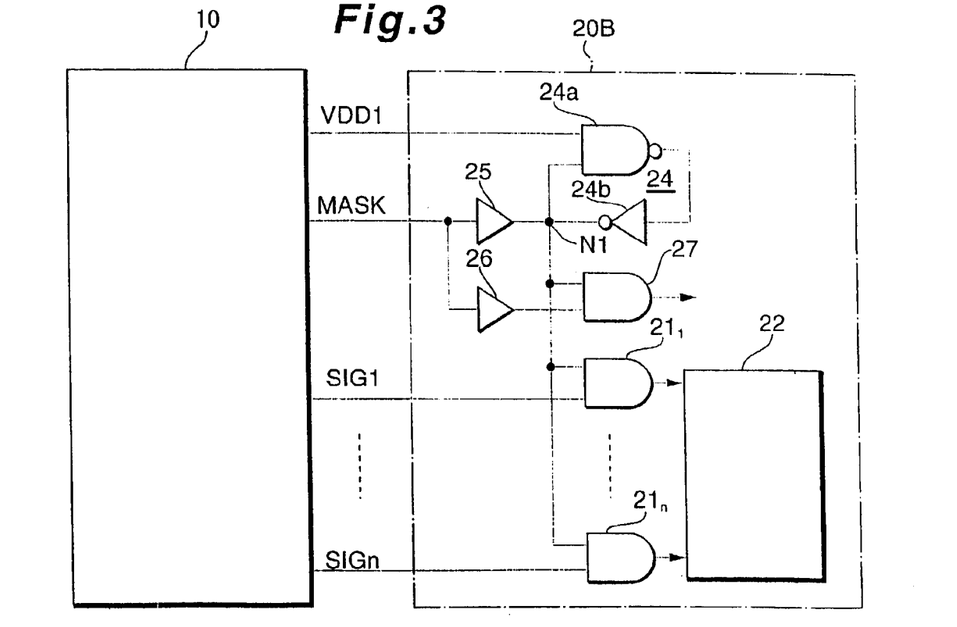
FIG. 3 is a block diagram showing second embodiment of integrated circuit of the present invention.

FIG. 3 is a block diagram showing embodiment 2 of integrated circuit of the present invention. In the FIG. 3, with respect to the same composition element as that in FIG. 1, the same symbol is assigned.

The integrated circuit is formed by adding buffers 25 and 26, and an AND 27 with two inputs into the integrated circuit described in the embodiment 1. The integrated circuit has a circuit block 20B containing the buffers 25 and 26, and the AND 27.

The buffer 25 amplifies the mask signal MASK output from the circuit block 10, and outputs the mask signal MASK to node N1. The buffer 26 is different from the buffer 25, it also amplifies the mask signal MASK output from the circuit block 10, but outputs the mask signal MASK to the first input terminal of the AND 27. The second input terminal of the AND 27 is connected with the node N1, the output terminal of the AND 27 is connected with an other circuit which is not shown by FIG. 3 and also uses the mask signal for other object different from mask control. In the integrated circuit, other composition elements are same as that in FIG. 1.

Next, to explain the operations of the integrated circuit shown by FIG. 3, in which buffers 25 and 26 are added.

When the mask signal MASK output form the circuit block 10 changes from "L" into "H", or from "H" into "L", the signal output from the latch circuit 24 to the node N1 conflicts with the signal output from the buffer 25 to the node N1 for an instant. At that time, because the driving ability of the buffer 25 is stronger than that of the inverter 24b, the level of the node N1 changes corresponding to the mask signal MASK. However, because the confliction of the two output signals respectively output from the buffer 25 and the inverter 24b, the change of the level of the node N1 is delayed a little.

In such state, even if a design for timing is performed based on a delay library, but because the change value of the output of the buffer 25 is different from the value registered in the library, so that the signal is judged that used in mask control. Thereby, in particular, there is no problem. Further, with respect to the buffer 26 and the AND 27 that use the mask signal MASK as other object different from mask control, because they use the mask signal MASK independently of the buffer 25, they would not be influenced by the confliction of the signals between the buffer 25 and the inverter 24b.

As stated above, in the embodiment 2, the integrated circuit has the buffer 25 and 26 that respectively amplify the mask signal MASK. Thereby, it is possible to output the mask signal MASK respectively towards the node N1 and the circuit for other object different from mask control, through respective routes. Further, in the circuit for other object, there is no influence due to the delay caused by the confliction between the mask signal MASK and the output signal of the latch circuit 24, it is possible to perform a design for timing based on a delay library.

<Embodiment 3>

Figure 4:
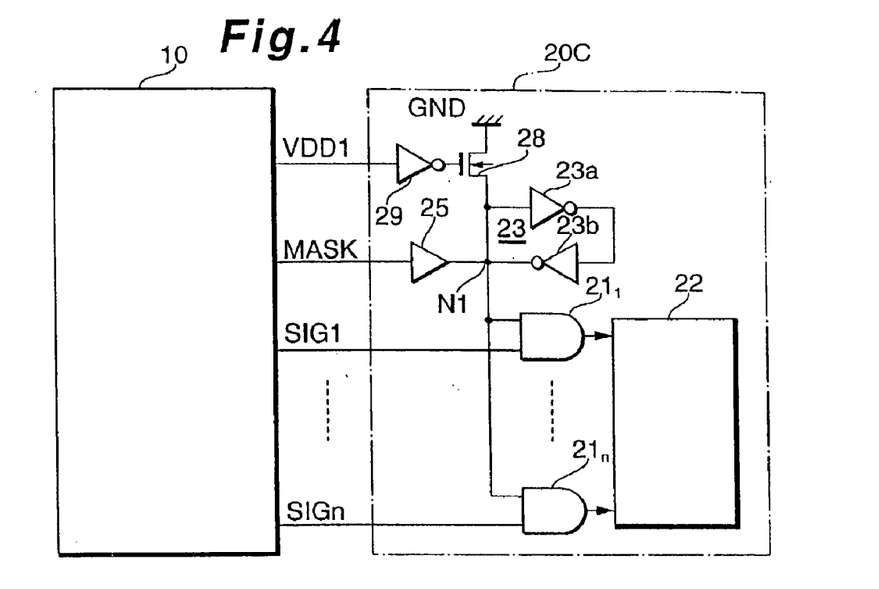
FIG. 4 is a block diagram showing third embodiment of integrated circuit of the present invention.

FIG. 4 is a block diagram showing embodiment 3 of integrated circuit of the present invention. In the FIG. 3, with respect to the same composition element as that in FIG. 2, the same symbol is assigned.

The integrated circuit has a circuit block 20C different from the circuit block 20 shown by FIG. 2. In the circuit 20C, a buffer 25, a NMOS 28 and an inverter 29 are provided. The buffer 25 for amplifying the mask signal MASK and output it to node N1; the NMOS 28 connected between the node N1 and the ground GND; and the inverter 29 for inverting the voltage VDD1 of the power supply and outputting the inverted signal to the gate of the NMOS 28. In the integrated circuit, other composition elements are same as that in FIG. 2.

Next, to explain the operations of the integrated circuit shown by FIG. 4.

In the case of making ready to break the power supply in the circuit block, first setting the mask signal MASK at "L"; then stopping the voltage VDD1 of the power supply of the circuit block 10. Thus, when the voltage VDD1 drops slowly from "H" level and becomes under the threshold of the inverter 29, the output signal of the inverter 29 becomes "H" level. by this, the NMOS 28 becomes on and the node N1 is fixed at "L" level.

Further, when the voltage VDD1 drops under operation guaranteeing range, even if the mask signal MASK changes into "H" level, at that time, because the node N1 is connected with the ground GND through the NMOS 28 indicating on state, so the node N1 is kept in "L" level. Thereby, these signals being output to the logical circuit 22 are kept in "L" level, that is, the input signals of the logical circuit 22 do not become high-impedance state.

Moreover, with respect to the circuit block 10, when the voltage VDD1 of the power supply is supplied again, the mask signal MASK is operated in a fixing state of "L", by operations such as reset or the like. Then with the voltage VDD1 rises slowly and goes over the threshold of the inverter 29, the output signal of the inverter 29 becomes "L" level. Thereby the NMOS 28 becomes off, so that the connection between the node N1 and the ground GND is cut.

Then, the mask signal is changed into "H". Thus, the latch circuit 24 in the circuit block 20C is set in "H" level by compulsion, so these signals SIG1~SIGn output from the circuit block 10 can be transferred to the logical circuit 22 through these ANDs $21_1$~$S21_n$.

As stated above, in the embodiment 3, the integrated circuit has a NMOS 28 capable of making the node N1 connect the ground when the voltage VDD1 of the power supply in the circuit 10 became "L". Thereby, the embodiment 3 has the same advantage as the embodiment 1. Further, in the embodiment 3, because the node N1 is connected with the ground GND when the effective power supply in the circuit block 10 is not be supplied, so even if the mask signal MASK contains noise, there is nothing for that the unstable signals SIG1~SIGn enter the logical circuit 22.

<Embodiment 4>

Figure 5:
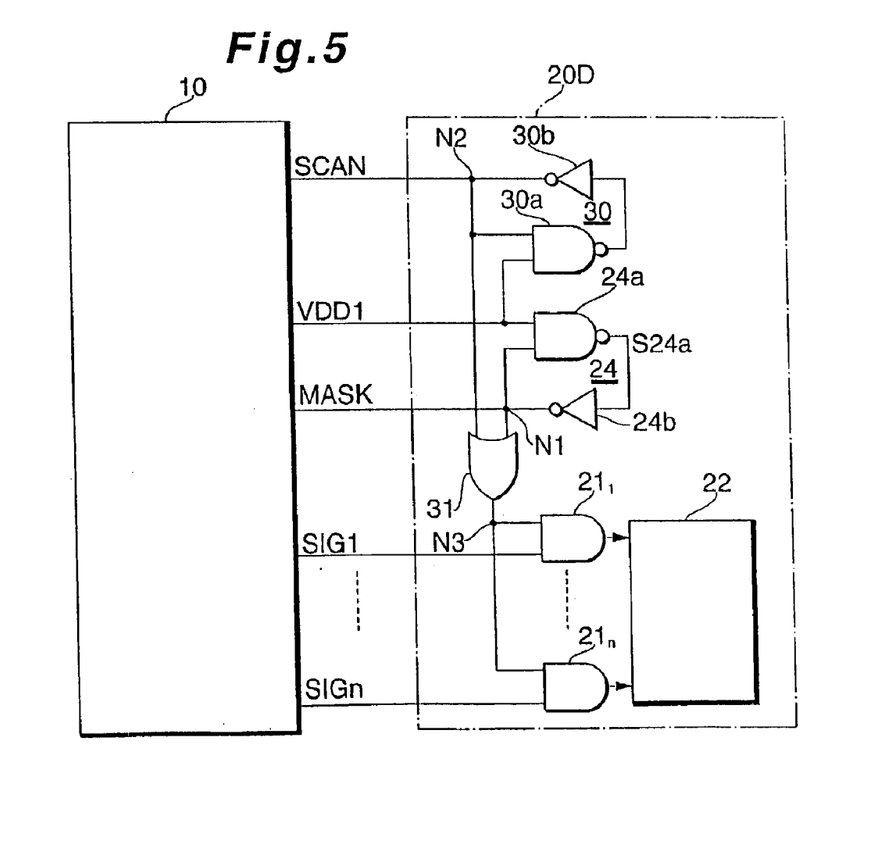
FIG. 5 is a block diagram showing fourth embodiment of integrated circuit of the present invention.

FIG. 5 is a block diagram showing embodiment 4 of integrated circuit of the present invention. In the FIG. 5, the same composition elements as that in FIG. 1 are assigned by the same symbols.

In the integrated circuit, the function for corresponding to the scan test is added. That is, the integrated circuit has a circuit block 20D, the circuit block 20D includes a latch circuit 24 for keeping a mask signal MASK, a latch circuit 30 for keeping a scan mode signal SCAN, and a logical sum gate (hereinafter: OR) 31 for obtaining a logical sum of the two output signals of the latch circuit 24 and the latch circuit 30.

The scan mode signal SCAN output from the circuit block 10 is transferred to a node N2 in the circuit block 20D, the node N2 is connected with the first input terminal of a NAND 30a in the latch circuit 30. Further, the second input terminal of the NAND 30a is connected with the power supply VDD1 in the circuit block 10, and the output terminal of the NAND 30a, through a inverter 30b, is connected with the node N2.

The nodes N1 and N2, are respectively connected with the two input terminals of the OR 31, the output terminal of the OR 31 is connected with a node N3. The node N3 is connected with all second input terminals of the ANDs $21_1$~$21_n$. In the embodiment, the other composition elements are same as that in embodiment 1 shown by FIG. 1.

In such integrated circuit, on one hand, when the voltage VDD1 of the power supply in the circuit block 10 is supplied for a scan test mode, the scan mode signal SCAN output from the circuit block 10 becomes "H". The scan mode signal SCAN is kept by the latch circuit 30, so the node n2 becomes "H", and the node N3 also becomes "H". Thus, the gates of the ANDs $21_1$~$21_n$, become on no depending upon the level of the mask signal MASK, so these signal SIG1~SIGn from the circuit block 10, through the ANDs $21_1$~$21_n$, enter the logical circuit 22. Therefore, it is possible to perform a scan test.

On the other hand, when the scan test mode is not executed, the scan mode signal SCAN becomes "L", so the node N2 also becomes "L". Thus, the level of the node N1 is just output to the node N3, then, the same operations as that in the embodiment 1 are performed.

As stated above, because the integrated circuit has the latch circuit 30 and the OR 31 for corresponding to the scan test, it is possible to sufficiently perform the scan test.

<Embodiment 5>

Figure 6:
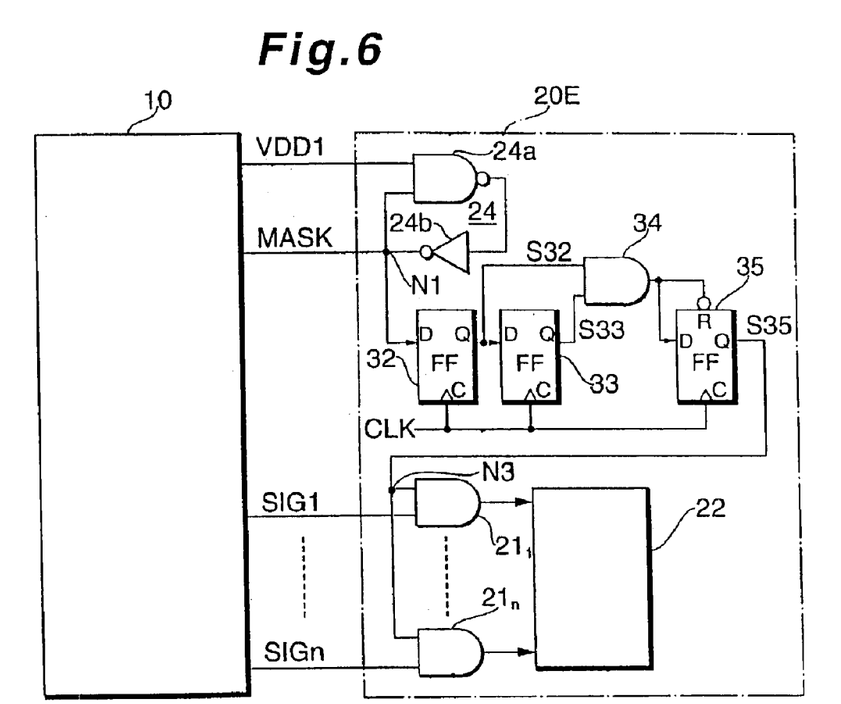
FIG. 6 is a block diagram showing fifth embodiment of integrated circuit of the present invention.

FIG. 6 is a block diagram showing embodiment 5 of integrated circuit of the present invention. In the FIG. 6, the same composition elements as that in FIG. 1, the common symbols are assigned.

In the integrated circuit, replacing the circuit block 20A in FIG. 1, a circuit block 20E is provided. The circuit block 20E has a filter circuit set in between the node N1 and the second input terminals of the ANDs $21_1$~$21_n$, the filter circuit is formed by three flip-flop circuits (hereinafter: FF) 32, 33 and 35, and a AND 34. When the node N1 becomes "L", the filter circuit outputs a signal S35 indicating "L" at predetermined timing (for example, the next start of clock signal); when the node N1 passed a prescribed time (for example, two periods of clock signal) and becomes "H", the filter circuit outputs a signal S35 indicating "H".

The input terminal D of the FF 32 in the filter circuit is connected with the node N1, the output terminal Q of the FF 32 is connected with the input terminal D of the FF 33 and the first input terminal of the AND 34. The output terminal Q of the FF 33 is connected with the second input terminal of the AND 34, the output terminal of the AND 34 is connected with the input terminal D and the reset terminal R of the FF 35. Then, the signal S35 output from the output terminal Q of the FF 35, through the node N3, is transferred to the second input terminals of the ANDs $21_1$~$21_n$. Further, the clock terminals C of the FFs 32, 33 and 35, in common, receive a clock signal. Moreover, with respect to other composition elements, they are same as that in FIG. 1.

Figure 7:
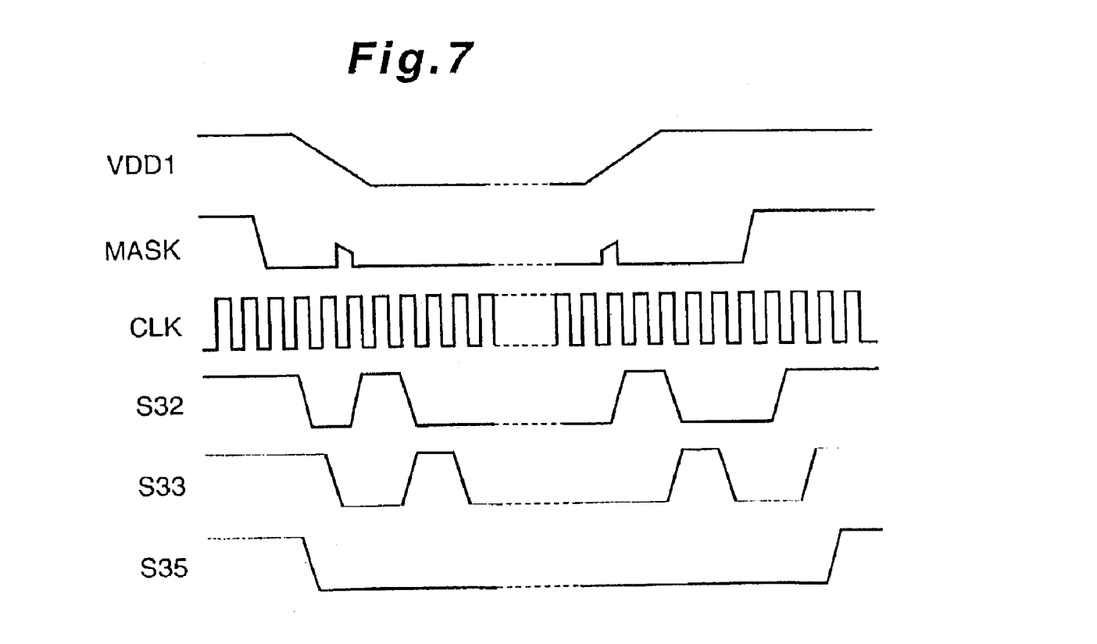
FIG. 7 is a signal wave-shape diagram showing operations of fifth embodiment.

FIG. 7 is a signal wave-shape diagram for explaining the operations of the integrated circuit shown by FIG. 6. Next, referring to the FIG. 7, to explain the operations of the embodiment 5.

When the power supply VDD1 in the circuit block 10 is supplied, the mask signal MASK output from the circuit block 10 is kept by the latch circuit 24. Then, the latch circuit 24 outputs a keeping signal to the node N1. The output signal on the node N1, synchronizing with the start of the clock signal, is kept in a shift register formed by the FFs 32 and 33.

The signals S32 and S33 respectively output from the FFs 32 and 33 are logically summed by the AND 34, the result of the logical sum is output to the input terminal D and the reset terminal R of the FF 35. Thus, when the mask signal MASK is being kept in "H", the signals S32 and S33 indicate "H", and the signal S35 output from the FF 35 also indicates "H".

When the mask signal changes from "H" into "L", the signal S32 changes into "L" at the timing of the start of the next clock signal. Thus, the output signal of the AND 34 becomes "L", then the signal S35 also becomes "L". Thereby, the output signals of the ANDs $21_1$~$21_n$ all become "L".

Then, the supply of the voltage VDD1 in the circuit block 10 is stopped. In this case, the voltage VDD1 drops slowly from "H" level and becomes under the threshold of the NAND 24a, the signal S24a of the NAND 24a becomes "H" level no depending upon the level of the node N1. By this, the signal S24b of the inverter 24b becomes "L" level.

Further, when the voltage VDD1 drops under operation guaranteeing range, if the mask signal MASK changes into "H" level and the node N1 becomes "H" at one time, at that time, in this state, the signal S32 of the FF 32 becomes "H" when the clock signal starts. However, the signal S33 of the FF 33 is keeping in "L", the signal S35 does not change so that is keeping in "L".

Because the voltage VDD1 further drops, at the time that the next clock signal starts, the mask signal MASK becomes "L". Thus, the signals S32 and S33 respectively become "L" and "H", but the signal S35 is keeping in "L" so that does not change. Thereby, it is possible to obtain the signal S35 which is not influenced by the temporary change of the mask signal MASK, so that no any unstable signal SIG1~SIGn enter the logical circuit 22.

Moreover, with respect to the circuit block 10, when the voltage VDD1 of the power supply is supplied again, the mask signal MASK is operated in a fixing state of "L", by operations such as reset or the like, after it, the mask signal MASK is changed into "H".

Then after two clock signals passed, the signal S35 becomes "H". Thus, these signals SIG1~SIGn output from the circuit block 10 can be transferred to the logical circuit 22 through these ANDs $21_1$~$S21_n$.

As stated above, in the embodiment 5, the integrated circuit has a filter circuit capable of outputting a signal S35 so as to make the all ANDs $21_1$~$S21_n$ become on when the mask signal MASK on the node N1 kept in "H" for more, than two clock periods. Thereby, even if the unstable mask signal MASK is output due to the stop of the power supply VDD1, and even if even if the mask signal MASK contains noise in the stop of the power supply VDD1, it is possible to eliminate these bad influences and to prevent the occurrence of penetrating electricity caused by the unstable signals SIG1~SIGn.

Moreover, the present invention is not limited to the foregoing embodiments but many modifications and variations are possible within the spirit and scope of the appended claims of the invention. Then, serving as modification examples, there are the following notes.

(a) The buffer 25 shown by FIG. 4 can be omitted.

(b) The composition of the filter circuit shown by FIG. 6 is not limited, if only there are the same functions, any composition can be applied.

As described above in detail, in the integrated circuit of the present invention, when a first power supply supplied to a first circuit block is effective, the level of a mask signal supplied to a first node is kept; when the first power supply is ineffectual, a latch circuit outputs a "L" to the first node. Thus, even if the mask signal becomes unstable owing to the breaking of the first power supply or the mask signal contains noise after the first power supply is broken, it is not caused that the signals output from the first circuit enter a second circuit block. Thereby, it is possible to prevent the occurrence of penetrating electricity caused by unstable input signals.

What is claimed is:

1. An integrated circuit, comprising:
   a first circuit block in which a first power supply is controlled;
   and a second circuit block which has logical circuit and in which a second power supply is always supplied,
   wherein when said first power supply is broken, a mask signal output to said second circuit block from said first circuit block is changed into low level from high level in order to cut off output signals of said first circuit block,
   wherein said second circuit block includes:
   a first node on which said mask signal is supplied;
   a first latch circuit which is formed by a first logical gate and a second logical gate, wherein said first logical gate inputs said first power supply and said mask signal, said second logical gate inputs a output signal of said first logical gate, and the output terminal of said second logical gate and the input terminal of said first logical gate are connected with said first node,
   wherein said first latch circuit keeps the level of said first node when said first power supply in said first circuit block is effective with respect to said second logical gate; and outputs a low level signal to said first node when said first power supply in said first circuit block is ineffectual.

2. The integrated circuit according to claim 1, further comprising a gate circuit which is respectively connected with the output of said first circuit block and said first node, inputs the output signals of said first circuit block if said first node indicates high level, and stops the input of said output signals if said first node indicates low level.

3. The integrated circuit according to claim 2, wherein said first gate and said second gate all are inverter.

4. The integrated circuit according to claim 2, wherein said second circuit block has a first buffer which amplifies said mask signal output from said first circuit block, then outputs said mask signal amplified to said first node.

5. The integrated circuit according to claim 4,
   wherein said second circuit block further has a second buffer which also amplifies said mask signal output from said first circuit block and outputs said mask signal amplified, and a optional control which outputs based on said mask signal output from said first circuit block and said second buffer, wherein said optional control gate is joined by optional circuit.

6. The integrated circuit according to claim 1, further comprising:
   a filter circuit which is connected with said first node, outputs a low level at a predetermined period when said first node indicates low level, and outputs a high level when said first node keeps high level for a prescribed time;
   a second node on which the output of said filter circuit is supplied;

a gate circuit which is respectively connected with a output terminal of said first circuit block and with said second node, inputs output signals of said first circuit block when said second node indicates high level, and stops the input of output signals of said first circuit block when said second node indicates low level.

7. The integrated circuit according to claim 6, wherein said first gate and said second gate all are inverter.

8. The integrated circuit according to claim 6, wherein said second circuit block has a first buffer which amplifies said mask signal output from said first circuit block, then outputs said mask signal amplified to said first node.

9. The integrated circuit according to claim 8, wherein said second circuit block further has a second buffer which also amplifies said mask signal output from said first circuit block and outputs said mask signal amplified, and a optional control which outputs based on said mask signal output from said first circuit block and said second buffer, wherein said optional control gate is joined by optional circuit.

10. The integrated circuit according to claim 1, further comprising:
    a third node on which a test mode signal output from said first circuit block is supplied;
    a second latch circuit which is formed by a third logical gate and a fourth logical gate;
    a input control circuit for outputting a control signal according to the levels of said first node and said third node;
    a four node on which a output of said input control circuit is supplied;
    a gate circuit which is respectively connected with a output terminal of said first circuit block and with said fourth node, inputs output signals of said first circuit block when said fourth node indicates high level, and stops the input of output signals of said first circuit block when said fourth node indicates low level,
    wherein said third logical gate inputs said first power supply in said first circuit block and said test mode signal, said fourth logical gate inputs a output signal of said third logical gate, and the output terminal of said fourth logical gate and the input terminal of said third logical gate are connected with said third node,
    wherein said second latch circuit keeps the level of said third node when said first power supply in said first circuit block is effective with respect to said third logical gate; and outputs a low level signal to said third node when said first power supply in said first circuit block is ineffectual.

11. The integrated circuit according to claim 10, wherein said first gate, said second gate, said third gate and said fourth gate all are inverter.

12. The integrated circuit according to claim 10, wherein said second circuit block has a first buffer which amplifies said mask signal output from said first circuit block, then outputs said mask signal amplified to said first node.

13. The integrated circuit according to claim 12, wherein said second circuit block further has a second buffer which also amplifies said mask signal output from said first circuit block and outputs said mask signal amplified, and a optional control which outputs based on said mask signal output from said first circuit block and said second buffer, wherein said optional control gate is joined by optional circuit.

14. An integrated circuit, comprising:
    a first circuit block in which a first power supply is controlled;
    and a second circuit block which has logical circuit and in which a second power supply is always supplied, wherein when said first power supply is broken, a mask signal output to said second circuit block from said first circuit block is changed into low level from high level in order to cut off output signals of said first circuit block, wherein said second circuit block includes:

a first node on which said mask signal is supplied;

a switch circuit which becomes off state when said first power supply in said first circuit block is effective, and becomes on state for making said first node receive a low level when said first power supply in said first circuit block is ineffectual;

a latch circuit which is formed by a first logical gate and a second logical gate;

a gate circuit which inputs the output signals of said first circuit block if said first node indicates high level; and stops the input of said output signals if said first node indicates low level, wherein said first logical gate inputs said first power supply and said mask signal, said second logical gate inputs a output signal of said first logical gate, and the output terminal of said second logical gate and the input terminal of said first logical gate are connected with said first node, wherein said first latch circuit keeps the level of said first node when said first power supply in said first circuit block is effective with respect to said second logical gate; and outputs a low level signal to said first node when said first power supply in said first circuit block is ineffectual.

15. An integrated circuit comprising:

a first circuit block providing a first power supply, a mask signal, and a plurality of output signals; and, a second circuit block receiving the first power supply, the mask signal, and the plurality of output signals;

wherein, upon failure of the first power supply, the mask signal as received in the second circuit block transitions from one logic level to another logic level, thereby terminating reception of the plurality of output signals in the second circuit block;

wherein the second circuit block further comprises:

a plurality of logic gates controlled by a signal apparent at a first node, wherein each one of the plurality of logic gates respectively controls reception of one of the plurality of output signals; and, a latch circuit receiving as inputs the mask signal and the first power supply to control the logic level of the signal apparent at the first node.

16. The integrated circuit of claim 15, wherein the latch circuit comprises:

a first logic gate receiving as inputs the signal apparent at the first node and the first power supply; and a second logic gate receiving as input an output from the first logic gate;

wherein the output of the second logic gate is connected to the first node.

17. The integrated circuit of claim 16 wherein the first logic gate is a negative logical product gate and the second logic gate is an inverter; and, wherein the mask signal is connected to the first node.

18. The integrated circuit of claim 15, wherein the latch circuit comprises:

a first inverter receiving as input the first power supply; and, a series of inverters receiving as input the signal apparent at the first node and providing to the first node a delayed version of the signal apparent at the first node; and, a transistor connected between ground and the first node, the gate of the transistor being connected to the output of the first inverter.

19. The integrated circuit of claim 18, further comprising:

a buffer receiving and amplifying the mask signal and providing an amplified mask signal to the first node.

20. The integrated circuit of claim 16 wherein the first logic gate is a negative logical product gate and the second logic gate is an inverter; and, wherein the latch circuit further comprises:

a first buffer receiving and amplifying the mask signal and providing an amplified mask signal to the first node.

21. The integrated circuit of claim 20 wherein the latch circuit further comprises:

a second buffer receiving and amplifying the mask signal; and, a control logic gate receiving as inputs the output of the second buffer and the signal apparent at the first node.

* * * * *